(12) United States Patent
Natsukawa

(10) Patent No.: US 9,035,695 B2
(45) Date of Patent: May 19, 2015

(54) SEMICONDUCTOR INTEGRATED CIRCUIT AND ELECTRONIC CIRCUIT

(71) Applicant: Noriyuki Natsukawa, Kanagawa (JP)

(72) Inventor: Noriyuki Natsukawa, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/020,968

(22) Filed: Sep. 9, 2013

(65) Prior Publication Data

US 2014/0077847 A1    Mar. 20, 2014

(30) Foreign Application Priority Data

Sep. 14, 2012 (JP) ................................. 2012-202222

(51) Int. Cl.
*G05F 1/10* (2006.01)
*G05F 3/02* (2006.01)
*H03K 3/011* (2006.01)
*G06F 1/26* (2006.01)

(52) U.S. Cl.
CPC . *H03K 3/011* (2013.01); *G06F 1/26* (2013.01)

(58) Field of Classification Search
CPC .................. H03K 19/17732; H03K 19/17748; H03K 17/24; H03K 3/011; G11C 11/4074; G11C 5/14; G11C 7/22

USPC .................................................. 327/540, 541
See application file for complete search history.

(56) References Cited

U.S. PATENT DOCUMENTS

2010/0123515 A1* 5/2010 Sasaki et al. .................. 327/540

FOREIGN PATENT DOCUMENTS

| JP | 11-007330 | 1/1999 |
| JP | 2006-261470 | 9/2006 |
| JP | 2007-250604 | 9/2007 |
| JP | 2009-094133 | 4/2009 |

* cited by examiner

*Primary Examiner* — John Poos
(74) *Attorney, Agent, or Firm* — Cooper & Dunham LLP

(57) ABSTRACT

A semiconductor integrated circuit and an integrated circuit, each of which includes multiple regions containing at least one switchable region to switch between supplying power and blocking power individually; a power supply controller to control switching supplying power and blocking power in the switchable region that switches supplying power and blocking power individually; a power supply variable impedance circuit to change a power supply impedance of the semiconductor integrated circuit; and a power supply impedance controller to obtain the power supplying state of the region from the power supply controller, to cause the power supply variable impedance circuit to change the power supply impedance, based on a supply state of the power in the switchable region.

20 Claims, 10 Drawing Sheets

SEMICONDUCTOR INTEGRATED CIRCUIT AND ELECTRONIC CIRCUIT

CROSS-REFERENCE TO RELATED APPLICATION

This patent application is based on and claims priority pursuant to 35 U.S.C. §119 to Japanese Patent Application No. 2012-202222, filed on Sep. 14, 2012 in the Japan Patent Office, the entire disclosure of which is hereby incorporated by reference herein.

BACKGROUND

1. Technical Field

The present disclosure relates to a semiconductor integrated circuit having a region capable of switching between supplying power and blocking supply of power individually, and an electronic circuit incorporating the semiconductor integrated circuit.

2. Related Art

While the manufacturing processes for semiconductor integrated circuits, such as System on Chip (SoC), Application-Specific Integrated Circuit (ASIC), Central Processing Unit (CPU), and Graphic Processing Unit (GPU), have resulted in ever greater densities, circuit sizes have continued to increase.

In addition, the semiconductor integrated circuit has built-in various universal interface (I/F) circuits. In particular, the SoC often has built-in not only multiple CPUs and GPUs but also a user logic circuit and multiple universal I/F circuits.

Therefore, in the semiconductor integrated circuit, power consumption tends to increase, and various methods to reduce power consumption have been proposed.

For example, when decreasing use of the circuit, a clock frequency is decreased to a minimum necessary operational frequency for data processing to reduce power consumption. When high-speed processing is required, the clock frequency is increased to execute the process performance. With this operation, the required process performance can be executed, and total power consumption can be decreased.

Further, in order to suppress leak current and further reduce power consumption, another approach proposes a semiconductor integrated circuit that has circuit regions (also called domains) capable of switching between supplying power and blocking power. In this example, inside the semiconductor integrated circuit, there are a circuit region in which the power is supplied (power supply is input) and a circuit region in which the power is not supplied (power supply is blocked). By blocking supply of power to a circuit that does not need to be operated, the leak current is suppressed and the power consumption is decreased.

However, if the above-described countermeasure to reduce the power consumption is performed, the power supply voltage may fluctuate, thus generating noise in the power supply. Noise arises because a resonance frequency determined by the power supply inductance and a power supply capacitance inside the semiconductor integrated circuit matches the spectrum of the operating current, causing the power supply to resonate. The power supply noise is amplified or superimposed due to fluctuation in the voltage level due to the resonance.

In order to solve this problem, for example, JP-2009-094133-A proposes a semiconductor integrated device in which a sensor detects a voltage level applied to the circuit by a sensor, identifies the voltage fluctuation (power supply voltage fluctuation) mode depending on the detection result of the sensor, dynamically changes the power supply impedance based on the determination result, and stops the power supply of a clock when the voltage level detected by the sensor reaches a dangerous level (extremely high voltage level or extremely low voltage level).

Although the above-described device can cope with the fluctuation in the power supply voltage caused by the change in the operational frequency, it is not readily applicable to a semiconductor integrated circuit having the domains to switch between two states of supplying power and blocking power individually. For example, when the sensor detects the voltage of the region in which the power supply is blocked, the detected voltage is identified as at a dangerous level for operation and the supply of the clock is stopped. However, the domain in which the power supply is blocked is not necessary to supply the clock, and thus this control operation is pointless. In addition, if supplying the clock to another domain in which another power supply is input due to this determination, normal operation cannot be performed.

Furthermore, if the sensor detects the voltage level of the domain in which the power supply is not blocked, the domain in which the power supply is blocked increases the fluctuation in the power supply voltage. This state is identified as a dangerous level for operation, supplying the clock is stopped. Therefore, the clock cannot be supplied to the domain in which the operation is needed, which disturbs normal operation.

SUMMARY

The present invention is conceived in view of the above-described circumstances, and provides a semiconductor integrated circuit and an electronic circuit that sets a switchable region capable of switching between supplying power and blocking supply of power individually and suppresses power noise caused by fluctuation in power supply.

In one exemplary embodiment of the present disclosure, there is provided an improved semiconductor integrated circuit that includes multiple regions, a power supply controller, a power supply variable impedance circuit, and a power supply impedance controller. The multiple regions contain at least one switchable region to switch between supplying power and blocking power individually. The power supply controller controls switching supplying power and blocking supply of power in the switchable region that switches supplying power and blocking power individually. The power supply variable impedance circuit changes a power supply impedance of the semiconductor integrated circuit. The power supply impedance controller obtains a power supplying state of the switchable region from the power supply controller, to cause the power supply variable impedance circuit to change the power supply impedance, based on the power supplying state of the switchable region.

In another embodiment of the present disclosure, there is provided an electronic circuit that includes the above-described semiconductor integrated circuit.

In yet another embodiment of the present disclosure, there is provided an electronic circuit that includes a semiconductor integrated circuit and a power supply impedance controller that is provided outside of the semiconductor integrated circuit. The semiconductor integrated circuit includes multiple regions containing at least one switchable region to switch between supplying power and blocking power individually; a power supply controller to control switching supplying power and blocking power in the switchable region that switches supplying power and blocking power individually; and a power supply variable impedance circuit to change a power supply impedance of the semiconductor integrated circuit. The power supply impedance controller obtains a power supplying state of the region from the power supply controller, to cause the power supply variable impedance circuit to change the power supply impedance, based on a supply state of the power in the switchable region.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
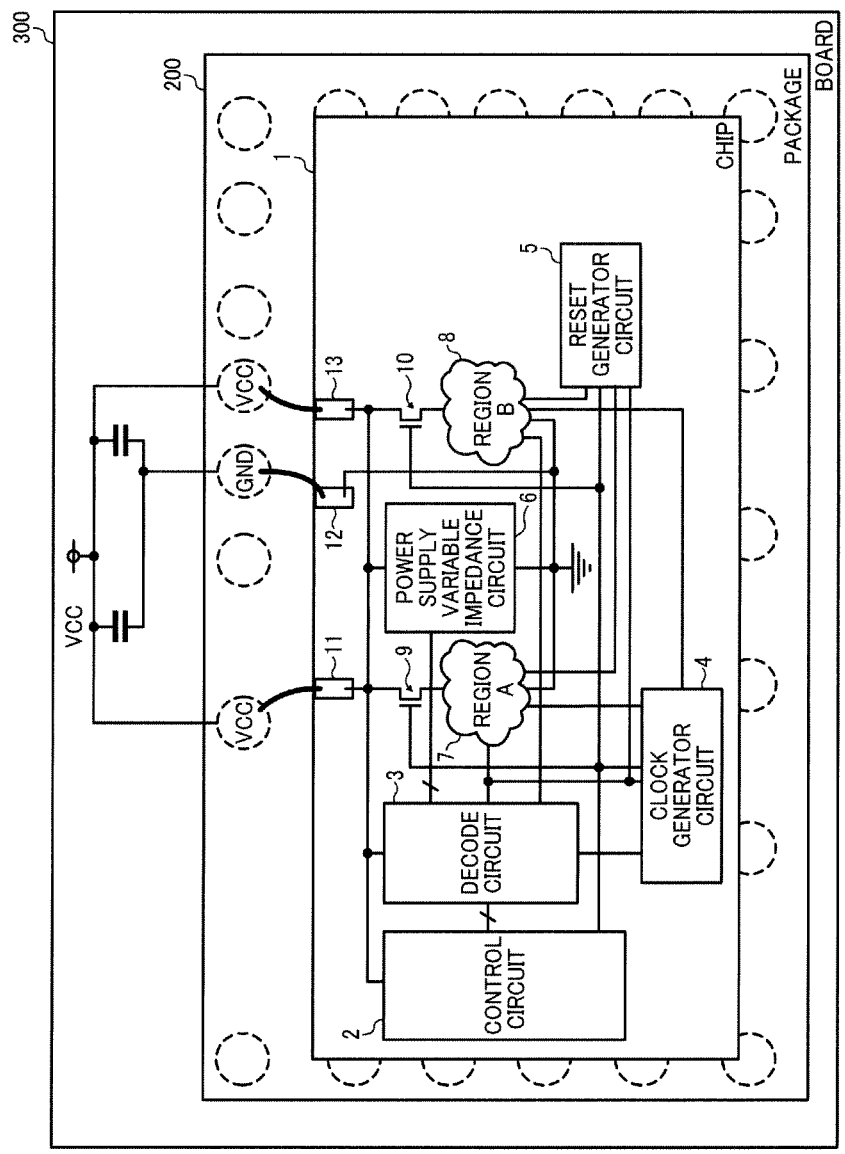
FIG 1 is a block diagram illustrating a configuration of a semiconductor integrated circuit according to a first embodiment of the present disclosure.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that have a similar function, operate in a similar manner, and achieve a similar result. Referring now to the drawings, wherein like reference numerals designate identical or corresponding parts throughout the several views thereof, and particularly to FIG 1, a semiconductor integrated circuit (electronic circuit) of the present disclosure is described.
(First Embodiment)

FIG 1 is a block diagram illustrating a configuration of a semiconductor integrated circuit 1 according to a first embodiment. In FIG 1, a chip 1 as the semiconductor integrated circuit includes a control circuit 2, a decode circuit 3, a clock generator circuit 4, a reset generator circuit 5, a power supply variable impedance circuit 6, a region (domain) A7, a region (domain) B8, a power supply/block circuits 9 and 10, internal power supply terminals 11 and 13, and an internal ground terminal 12.

In addition, the chip 1 is sealed in a package 200 formed of resin or like, and the package 200 is mounted on a board 300. A power supply circuit mounted on the board 300 supplies a power voltage Vcc to the chip 1 via the package 200.

The control circuit 2, serving as a power supply controller, controls supplying power and blocking supply of power to the region A7 and the region B8, and sets the sequence of supplying power and blocking supply of power to the regions. In addition, the control circuit 2 outputs a control signal indicating supplying power and blocking supply of power in the regions A7 and B8 for the decode circuit 3 to change capacitance value and resistance value in the power supply variable impedance circuit 6.

Figure 2:
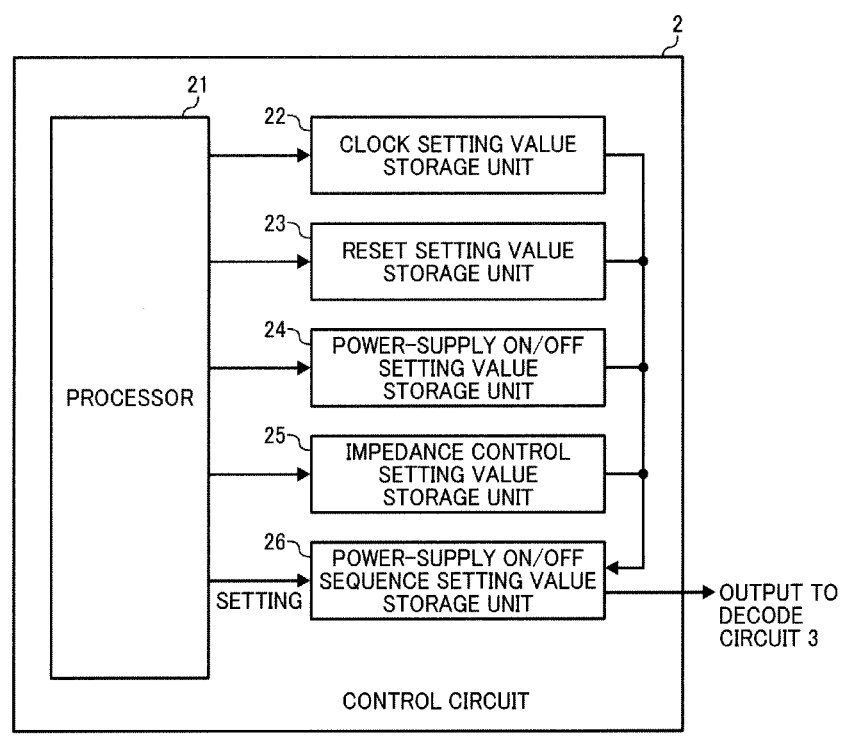
FIG 2 is a diagram illustrating a configuration of a control circuit shown in FIG 1.

FIG 2 is a configuration diagram of the control circuit 2. The control circuit 2 includes a controller 21, a clock setting value storage unit 22, a reset setting value storage unit 23, a power supply ON/OFF setting value storage unit 24, an impedance control setting value storage unit 25, and a power supply ON/OFF sequence setting value storage unit 26. The controller 21 is a circuit to set an operation sequence of supplying power and blocking supply of power in the region A7 and region B7 controlled by the control circuit 2. The clock setting value storage unit 22 stores the setting values whether or not a clock signal generated by the clock generator circuit 4 is supplied or not (ON/OFF) to the respective regions A7 and B8 or a frequency of the clock signal. The reset setting storage unit 23 stores setting of ON/OFF of the reset signal generated by the reset generator circuit 5. The power supply ON/OFF setting value storage unit 24 stores setting values of supplying power (ON) and blocking supply of power (OFF) to the regions A7 and B8.

The impedance control setting value storage unit 25, serving as an impedance holder, stores a signal corresponding to the setting value of the impedance output from the decode circuit 3. That is, the impedance control setting value storage unit 25 holds the impedance setting value issuing an instruction to the power supply variable impedance circuit 6.

The power supply ON/OFF sequence setting value storage unit 26, serving as the sequence holder, stores the setting values (operation order) of the sequence for operating the control circuit 2, and outputs the control signals to the clock generator circuit 4, the reset generator circuit 5, and the power supply variable impedance circuit 6. That is, the power supply ON/OFF sequence setting value storage unit 26 holds the sequence of the supplying power and blocking supply of power to the respective regions A7 and B8.

The clock setting value storage unit 22, the reset setting value storage unit 23, the power supply ON/OFF setting value storage unit 24, the impedance control setting value storage unit 25, and the power supply ON/OFF sequence setting value storage unit 26 may be constituted by a register or memory. Alternatively, these storages may be constituted by elements such as re-tension flip-flop or a non-volatile memory that enables to hold the value even when the power supply is cut off. By constituting the element that can keep the value, setting of the sequence in which the fluctuation in the power supply is small and the power supply impedance setting value in the state in which the chip 1 is mounted can be kept, even when the power supply is cut off.

Figure 3:
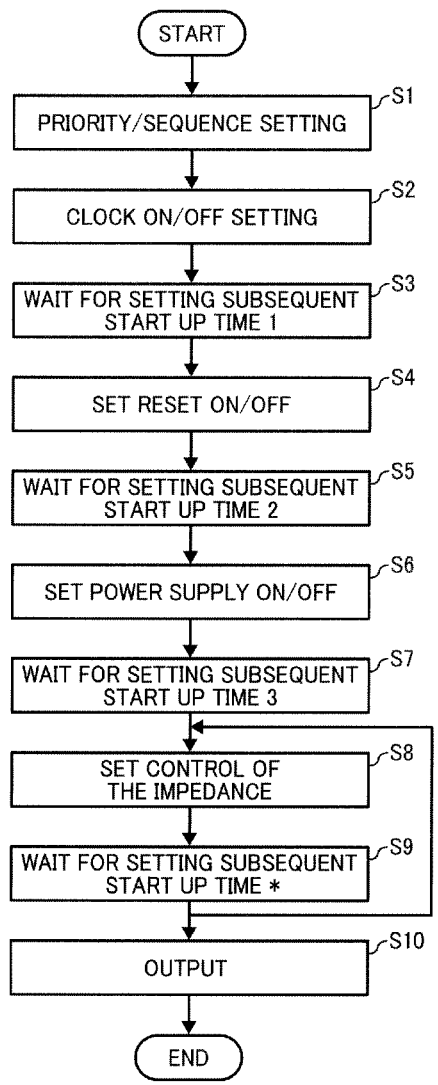
FIG 3 is a flow chart illustrating an operation sequence of the control circuit shown in FIG 1.

Next, an operation process (sequence) of the controller 21 is described below with reference to FIG 3. FIG 3 is a flow chart illustrating an operation sequence of the control circuit 2 shown in FIG 1. Initially, at step S1, as priority and sequence setting, the order and priority of supplying power and blocking supply of power for each of the regions are set. This setting at S1 is set in the power supply ON/OFF sequence setting value storage unit 26 and can arbitrarily set.

Then, at step S2, as clock ON/OFF setting, ON/OFF of the clock signals supplied to the regions are set based on the setting of step S1. The value of the clock ON/OFF setting is stored in the clock setting value storage unit 22, and the control signal is output to the clock generator circuit 4 via the decode circuit 3. At step S2, if the frequency of the clock signal can be changed, the setting of the clock frequency can be performed.

Subsequently, at step S3, the controller 21 waits a time interval until a predetermined next step is started as activation time setting (1). By setting this waiting time, for example, after the ON/OFF of the clock (clock generator circuit 4 is controlled) is performed, ON/OFF of the reset (control of the clock generator circuit 5) can be securely set. This time interval of the control signal can be set by measuring by a counter and a timer or delayed by a delay circuit such as shift register.

Then, at step S4, as the reset ON/OFF setting, ON/OFF of the reset signals supplied to the regions are set. With this setting, the value is stored in the reset setting value storage unit 23, and the control signal is output to the reset generator circuit 5 via the decode circuit 3.

At step S5, the controller 21 waits a time interval until a predetermined next step is started as activation time setting (2). This step S5 is executed similar to the activation (1). By setting the steps S5 and S3, ON/OFF of the clock signal and ON/OFF of the reset signal can be controlled before the power supply is blocked and after the power is supplied.

At step S6, as power supply ON/OFF setting, ON/Off of the power supplies to the respective domains are set. The ON/OFF of the power supply is set based on the control signal indicating operation finish and operation start generated inside the chip 1 and a signal externally input via an external terminal. This setting is stored in the power supply ON/OFF setting storage unit 24, and is output to the power supply/block circuits 9 and 10. Then, at step S7, the controller 21 waits a time interval until a predetermined next step is started as activation time setting (3). The step S7 is executed similar to the activation time setting (1) and (2).

Subsequently, at step S8, as the impedance control setting, based on the setting of clock, reset, and power supply at steps S1 to S6, the power supply impedance is controlled. That is, at the timing of this step, the decode circuit 3 outputs the control signal (setting value) of the power supply impedance. Then, at step S9, the controller 21 waits a time interval until a predetermined next step is started as activation time setting. The process returns to step S8 again, after this process of step S9 is executed, and the controller 21 sets the control of the impedance. With this setting, the controller 21 sets the control of the impedance at a predetermined time interval by outputting the control signal to the decode circuit 3 to change the power supply impedance. It is to be noted that, though it is not shown, when the process returns to step S8, ON/OFF of the clock, ON/OFF of the reset, and ON/OFF of the power supply are set again.

Then, at step S10, the process of this flow chart is finished. On operating the chip 1 (control circuit 2), the process basically proceeds in sequence from step S9 returning to the step S8. After the operation of the chip 1 is finished, the process proceeds to step S10.

The decode circuit 3, serving as a power supply impedance controller, outputs the setting value to the power supply variable impedance circuit 6, based on the signal input from the control circuit 2, this setting value corresponds to the control value that changes the capacitance value and resistance value in the power supply variable impedance circuit 6. That is, the decode circuit 3 obtains a power supplying state to the domain from the power supply controller 2, and controls the power supply variable impedance circuit 6 for changing the power supply impedance.

The decode circuit 3 receives, for example, a control signal, output from the control circuit 2, indicating the setting of a frequency dividing circuit to the clock generator circuit 4, a control signal indicating the setting value for the reset generator circuit 5, and control signals used for the power supply/block circuits 9 and 10. Then, the decode circuit 3 outputs the setting value of the power supply impedance for the power supply variable impedance circuit 6. More specifically, the decode circuit 3 outputs the setting values of the capacitance and the resistance constituting the power supply impedance, the control signal output to the reset generator circuit 5, the control signal to stop the PLL 43 in the clock generator circuit 4, and a control signal (Power_Off_clk) to stop the clock in the clock generator circuit 4. That is, the decode circuit 3 receives at least the control signal for the power supply/block circuits 9 and 10 and outputs the setting value of the power supply impedance for the power supply variable impedance circuit 6.

Figure 4:
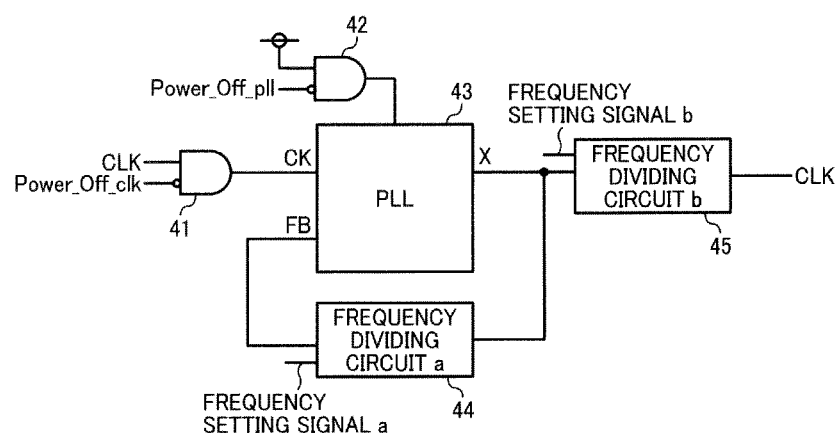
FIG 4 is a circuit diagram illustrating a clock generator circuit shown in FIG 1.

FIG 4 is a circuit diagram illustrating the clock generator circuit 4 shown in FIG 1. As illustrated in FIG 4, the clock generator circuit 4 includes AND circuits 41 and 42, the PLL circuit 43, a first frequency dividing circuit 44 and a second frequency dividing circuit 45. The AND circuit 41 calculates NOT-OR operation between the clock signal input from outside of the chip 1 and a signal Power_Off_clk, output from the decode circuit 3, as a control signal to stop the clock of the clock generator circuit 4 for output to the PLL circuit 43. More specifically, the AND circuit 41 can stop the input of the clock signal using the signal. The AND circuit 42 calculates NOT-OR operation between a high-level power supply voltage and a control signal Power_Off_pll, output from the decode circuit 3, to stop the PLL circuit 43 of the clock generator circuit 4.

The PLL 43 is a known phase locked loop, including a phase comparator and a voltage control oscillator (VCO) to generate an output whose phase is synchronized with the input signal. An input clock terminal (CK) of the PLL 43 is connected to an output of the AND circuit 41, and a feedback terminal (FB) of the PLL 43 is connected to an output of the first frequency dividing circuit 44. An output terminal (X) of the PLL 43 is connected to the input of the first frequency dividing circuit 44 and the input of the second frequency dividing circuit 45. The PLL 43 is connected to the output of the AND circuit 42, and the operation and stop of the PLL 43 are controlled based on the output signal of the AND circuit 42.

The first frequency dividing circuit 44 receives the output from the PLL 43, a frequency setting signal "a" as a control signal indicating the setting of the frequency dividing circuit 44 for the clock generator circuit 4 output from the control circuit 2, and divides the frequency of the output of the PLL 43 based on the frequency setting signal "a" to output. The second frequency dividing circuit 45 receives the output from the PLL 43 and a frequency setting signal "b" as a control signal indicating the setting of the frequency dividing circuit for the clock generator circuit 4 output from the control circuit 2, and divides the frequency of the output of the PLL 43 based on the frequency setting signal B for output.

Figure 5:
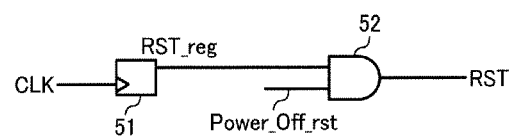
FIG 5 is a circuit diagram illustrating a reset generator circuit shown in FIG 1.

FIG 5 is a circuit diagram illustrating the reset generator circuit 5 shown in FIG 1. In FIG 5, the reset generator circuit 5 includes a reset register 51 and an AND circuit 52. The reset register 51 is a register in which the value (reset assert and negate) is set based on a control signal RST_reg indicating the setting value for the reset generator circuit 5 output from the control circuit 2. The AND circuit 52 calculates NOT-OR operation between the control signal RST_reg and a control signal Power_Off_rst (control signal to mask the reset signal) output from the reset register 51 and the decode circuit 3 to the reset generator circuit 5 for output to the region A and region B8 as a reset signal RST.

The power supply variable impedance circuit 6 is a circuit that changes the power supply impedance in the chip 1, as controlled by the decode circuit 3. The power supply variable impedance circuit 6 has a circuit configuration designed to change the capacitance value and the resistance value.

The capacitor is formed by, for example, an insulating capacitance layer, a parasitic capacitance layer, and a wiring capacitance layer. Specifically, the insulating capacitance layer may be formed by using a Metal-Oxide-Semiconductor Field-Effect Transistor (MOSFET) or an insulating layer. The parasitic capacitance layer may be formed by a parasitic capacitor contained in an element-unique MOSFET or the like or by using the capacitance when the transistor element is off. This layer can be formed by arranging the MOSFET. The capacitance of the wiring capacitance layer is formed wiring, and the capacitance can be changed by changing the configuration of the wiring.

As for the resister, the resistor element is formed in the semiconductor integrated circuit or by using a parasitic resistor or a wiring resistor. With the parasitic resistor, the MOSFETs are arranged in an array. With the wiring resistors, the length of the wiring, and the diameter of the wiring are changed as convenient to acquire the desired resistance.

Figure 6:
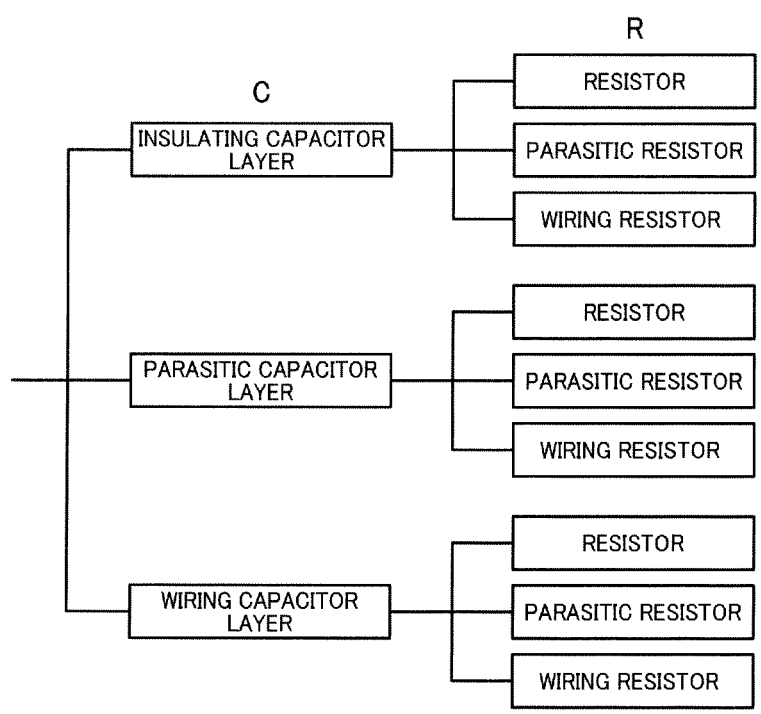
FIG 6 is a diagram illustrating a combination of capacitances and resistances constituting a power supply variable impedance circuit shown in FIG 6.

The combination of capacitors C and resistors R is described below. FIG 6 is a diagram illustrating a combination of capacitors and resistors constituting a power supply impedance circuit 6. As illustrated in FIG 6, by combining the three types of capacitor configuration methods and three types of resistors, nine types of capacitors and resistors constituting the power supply variable impedance circuit 6 can be obtained.

Figure 7:
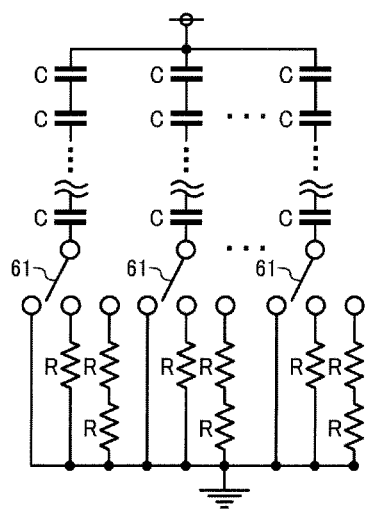
FIG 7 is a circuit diagram illustrating one example of the power supply variable impedance circuit shown in FIG 1.
Figure 9:
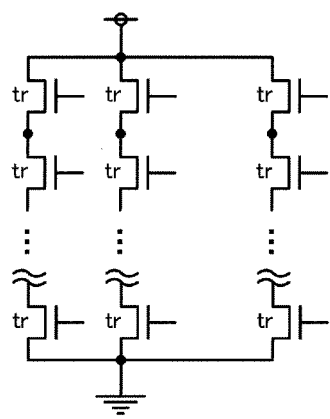
FIG 9 is a circuit diagram illustrating yet another example of the power supply variable impedance circuit shown in FIG 1.

FIGS. 7 and 9 illustrate circuit diagrams illustrating power supply variable impedance circuit 6. FIG 7 is one example constituted by the insulating capacitance layer as a capacitor and a resistance element as the resistor. In FIG 7, multiple circuit in which the capacitors C are connected in series are arranged in parallel, the selection circuit 61 performs switching control based on the power supply impedance output from the decode circuit 3. Noted that in FIG 7, there is a circuit in which the resistor R is not present, and this configuration can be adopted in accordance with the setting range of the power supply impedance.

Figure 8:
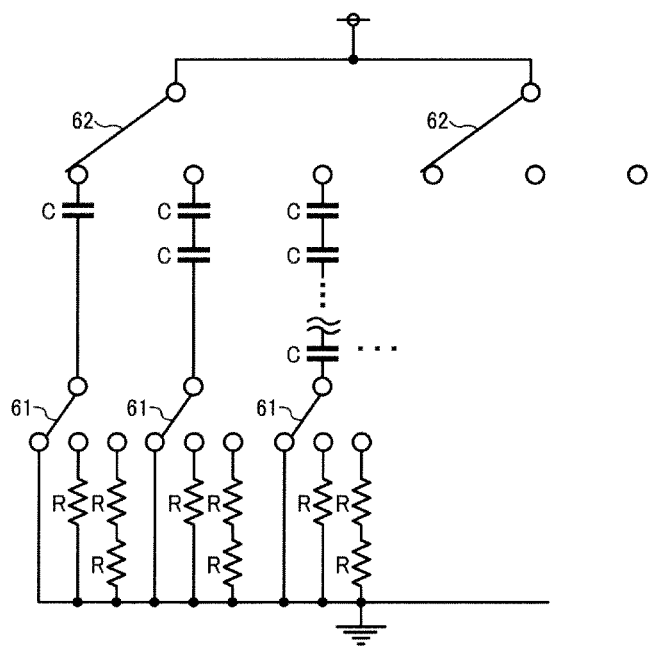
FIG 8 is a circuit diagram illustrating another example of the power supply variable impedance circuit shown in FIG 1.

FIG 8 is another example of the power supply variable impedance circuit 6. The configuration of FIG 8 is different from the point that a circuit connected to the capacitor C can be selected by a selection circuit 62. The selection circuit 62 performs switching control based on the setting value of the setting value of the power supply impedance output from the decode circuit 3. Herein, in the configuration shown in FIG 8, the circuit size becomes large due to the selection circuit 62. Alternatively, instead of the selection circuit 61 and 62, switching is performed by the transistor.

FIG 9 is yet another example of the power supply variable impedance circuit 6 in which the parasitic capacitor is used as the capacitor, and the parasitic resistor is used as the resistor R. In FIG 9, by connecting in parallel to the multiple circuits in which MOSFET Tr are connected in series, the transistors are arranged in array. FIG 9 is one example using the transistor to switch the capacitance values and a resistance values.

That is, the gate of the MOSFET Tr is controlled based on the setting value signal of the power supply impedance output from the decode circuit 3.

The regions A7 and B8 are the circuits to implement the function of the chip 1 (for example, user logic circuit), which is constituted by one or more circuit blocks. The region A7 and B8 are switchable between two states of supplying power and blocking supply of power, and both region A7 and B8 constitute respective individual switchable domains to switch between supplying power and blocking supply of power individually. Herein, although the two regions A7 and B8 included in the chip 1 respectively function as the switchable domains to switch between supplying power and blocking supply of power individually as shown in FIG 1, but at least one switchable domain is enough for switching supplying power and blocking supply of power individually.

The power supply/block circuits 9 and 10 are constituted by transistors. The power supply/block circuit 9 is provided between the internal power supply terminal 11 and the region A7, and the power supply/block circuit 10 is provided between the internal power supply terminal and the region B8. ON (connect) and OFF (disconnect) of the power supply/block circuits 9 and 10 are controlled based on the control signal output from the control circuit 2, to switch between supplying power and blocking of supplying power individually to the respective regions A7 and B8.

It is to be noted that, the power supply/block circuits 9 and 10 are constituted by transistors (MOSFET) shown in FIG 1. However, the power supply/block circuits 9 and 10 may be constituted by a switch formed by Micro Electro Mechanical Systems (MEMS) or a relay circuit.

The internal power supply terminals 11 and 13 are the terminals to receive a power voltage (Vcc) supplied from outside of the chip 1. The internal ground terminal 12 is a terminal to connect to the ground (GND) positioned outside of the chip 1.

In the above-configured chip 1, when the control circuit 2, using the control signal to the power supply/block circuits 9 and 10, controls supplying power and blocking supply of power to the regions A7 and B8, the decode 3 outputs the setting value of the power supply impedance to the power supply variable impedance circuit 6, based on the frequency setting of the clock signal generated by the clock generator circuit 4. The power supply variable impedance circuit 6 changes the capacitance value and the resistance value based on the setting value of the power supply impedance for the power supply variable impedance circuit 6, to change the power supply impedance.

In the present embodiment, the decode circuit 3 acquires the power supplying state of the regions A7 and 138 and causes the power supply variable impedance circuit 6 to change the power supply impedance, which can adjust the power supply impedance that fluctuates depending on supplying power and blocking supply of power to the regions A7 and B8 to suppress the power supply noise caused by the fluctuation in the power voltage.

In addition, the frequency setting signals "a" and "b" are input to the decode circuit 3, which can adjust the power supply impedance considering the operation frequency of the regions A7 and B8.

In addition, the control circuit to control supplying power and blocking supply of power to the regions A7 and B8 is configured to be separated from the decode circuit 3 that controls the power supply variable impedance circuit 6. Therefore, only by adding the decode circuit 3 to a semiconductor integrated circuit that supplies power and blocks supply of power to the regions A7 and B8, adjustment function of the power supply impedance can be easily implemented.

Further, since the control circuit 2 includes the impedance control setting value storage unit 25 and the power supply ON/OFF sequence setting storage unit 26, the control circuit 2 can store the setting value of the power supply impedance setting value and the operation sequence of the power supply ON and OFF, which enables to control using a hardware configuration or software configuration. When the impedance control setting value storage unit 25 and the power supply ON/OFF sequence storage unit 26 are configured by non-volatile elements, if the power of the chip 1 is supplied again, the control circuit 2 can operate using the stored value, and the setting time of the sequence can be shortened.

Alternatively, the control circuit 2 and the decode circuit 3 may be not provided separately but provided integrally. With this configuration, the circuit configuration can be optimized, and circuit size can become smaller.

In addition, although the control circuit 2 is designed to be operated based on the setting sequence, alternatively, the control circuit 2 may be externally controlled. With this configuration, the sequence can be directly controlled from an external device, such as external host. In addition, the values in the clock setting value storage unit 22, the reset setting value storage unit 23, the power supply ON/OFF setting value storage unit 24, the impedance control setting value storage unit 25, and the power supply ON/OFF sequence setting value storage unit 26 can be directly set via the external terminal. In this case, the sequence is directly controlled by the external device, such as external host.

(Second Embodiment)

Figure 10:
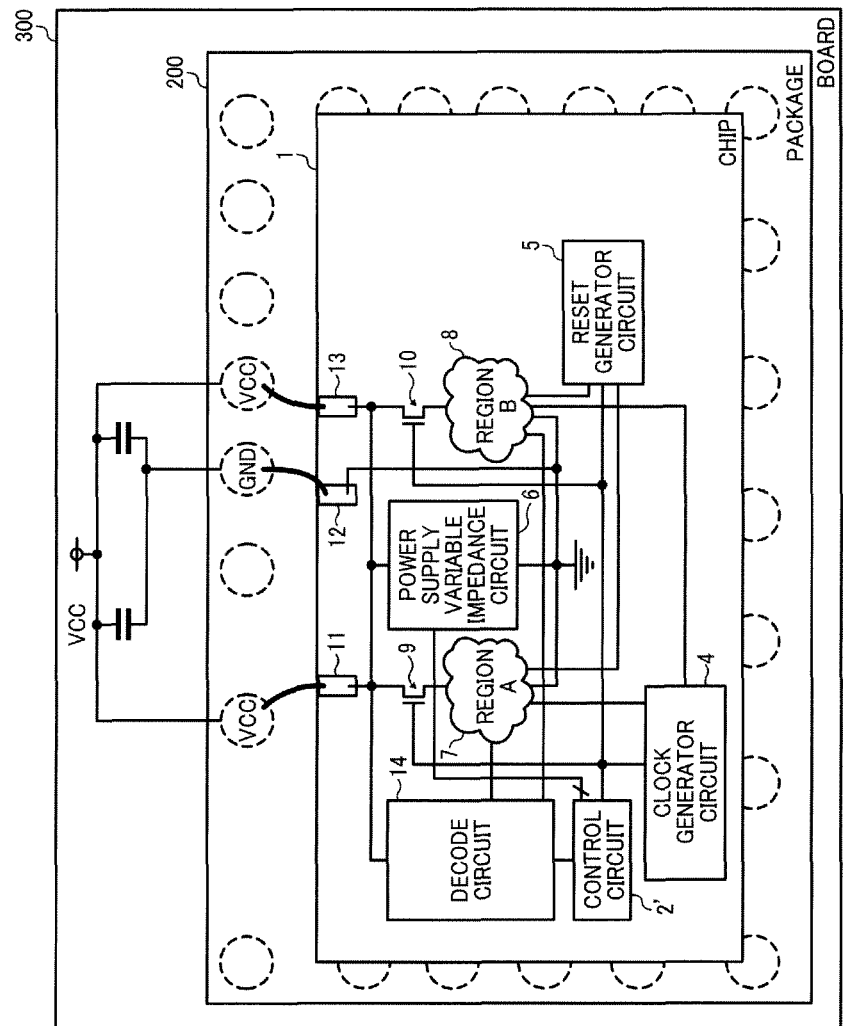
FIG 10 is a block diagram illustrating a configuration of a semiconductor integrated circuit according to a second embodiment.

Next, a chip 1A of a second embodiment is described below with reference to FIG 10. FIG 10 is a block diagram illustrating a configuration of a semiconductor integrated circuit according to a second embodiment. It is to be noted that, for ease of explanation and illustration, because other than the difference described above the second embodiment has a configuration similar to the configuration of the first embodiment, other components of the second embodiment are represented by identical numerals and the description thereof is omitted below.

In the chip 1A of the present embodiment, the basic configuration is similar to the first embodiment shown in FIG 1, but a frequency detection circuit 14 is added to the chip 1 as illustrated in FIG 10, and a control circuit 2' is used instead of the control circuit 2.

The frequency detection circuit 14, serving as a frequency detector, receives the clock signals from the region A7 and region B8.

The control circuit 2' has both functions of the control circuit (power supply control circuit) 2 and the decode circuit (power supply impedance controller) 3. Since the control circuit 2' receives the frequency of the region A7 and B8 detected by the frequency detection circuit 14, a region, corresponding to the decode circuit 3 in the control circuit 2' decodes the received frequency of the region A7 and B8.

That is, in the present embodiment, instead of the control signal to the clock generator circuit 4, the operation frequency of the circuit is detected from the clock signal, and the power supply impedance is changed based on the detected operational frequency and the power supplying state of the respective domains. In the present embodiment, the clock signal is one type in the chip 1A, alternatively, when the multiple types of clock signals are used different for each domain, and the clock is stopped for the each domain, this embodiment is efficient.

In the present embodiment, the frequency detection circuit 14 detects the frequency of the regions A7 and B8 to perform fine control of the power supply impedance based on the operational frequency of the actual circuit.

Herein, in the above-described first and second embodiments, both supplying power and blocking supply of power are switched using the regions A7 and B8 is described. Alternatively, for example, an domain in which only the domain A7 to switch between supplying power and blocking supply of power individually and the domain B8 in which the power supply is constantly supplied during the operation of the chip 1A can be used for the present embodiment.

(Third Embodiment)

Figure 11:
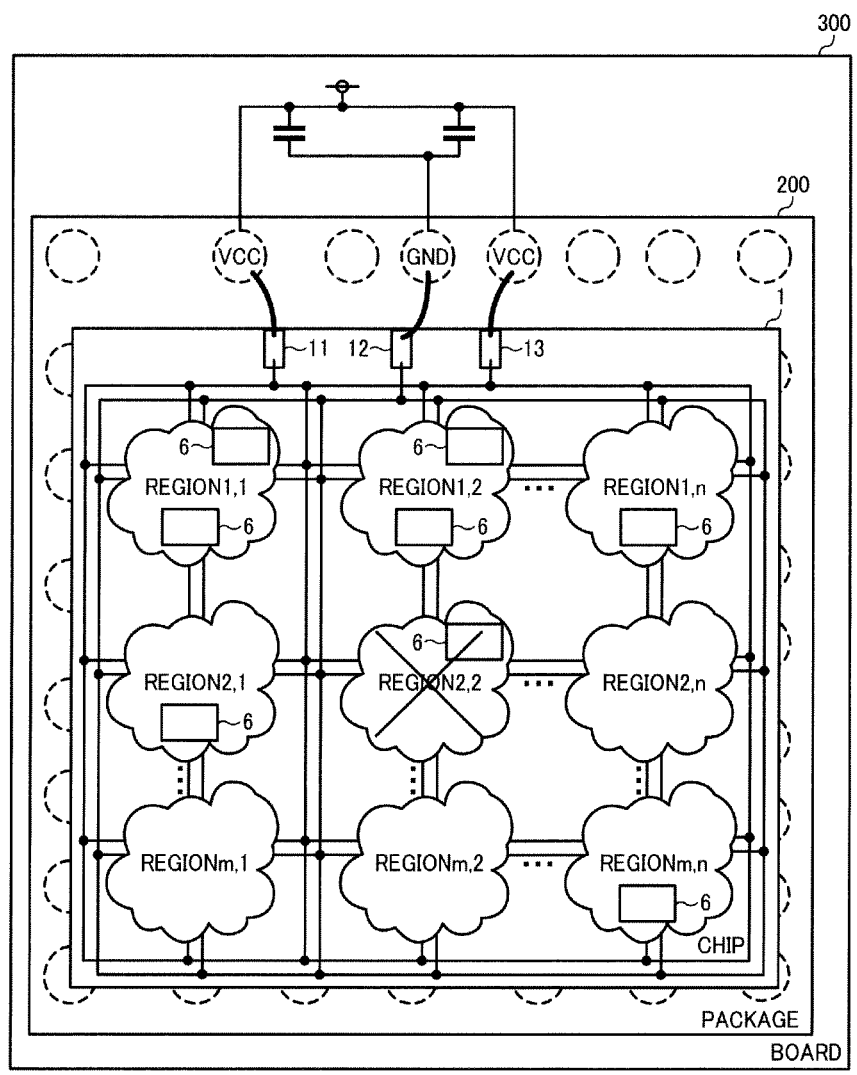
FIG 11 is a block diagram illustrating a configuration of a semiconductor integrated circuit according to a third embodiment.

Next, a chip 1B of a third embodiment is described below with reference to FIG 11. FIG 11 is a block diagram illustrating a configuration of a semiconductor integrated circuit 1B according to a third embodiment. It is to be noted that, for ease of explanation and illustration, because other than the difference described above the third embodiment has a configuration similar to the configuration of the first and second embodiments, other components of the third embodiment are represented by identical numerals and the description thereof is omitted below.

The chip 1B of the present disclosure is illustrated in FIG 11. The chip 1B shown in FIG 11, at least three switchable domains to switch between supplying power and blocking supply of power individually are present. The regions (1.1) to region (m, n) are the circuits to achieve the function of the chip similar to the region A7 and the region B8 shown in FIGS. 1 and 2, which are constituted by one or multiple circuit blocks.

In the respective regions, the power supply variable impedance circuit 6 is configured to be a cell (macro cell).

On the chip 1B, the control circuit and the decode circuit configured to control the multiple power supply variable impedance circuit 6 individually, as described in the first and the second embodiments, are provided. In the power supply variable impedance circuit 6, multiple power supply variable impedance circuits 6 may be provided in one region, similarly to, for example, the region (1.1) contains two power supply variable impedance circuits 6. Alternatively, similarly to FIG 1, the power supply variable impedance circuit 6 may be provided outside of the region.

In addition, the power supply variable impedance circuits 6 provided in the respective domains include a switching circuit constituted by the switch such as transistors, for supplying power. When the power supply provided in the region is blocked, the switching circuit switches the powers. If the power supply provided in a certain region is blocked, only the power supply variable impedance circuit 6 provided in the region in which the power supply is blocked is activated.

With this operation, when the power supply impedance is to be adjusted using the multiple power supply variable impedance circuits 6, the power supply variable impedance circuit 6 in which the power supply is blocked can be used. Further, this configuration does away with the need to arrange the power supply variable impedance circuits 6 in the all regions, the number of the power supply variable impedance circuit 6 can be decreased.

For example, when the power supply in the region (2, 2) is blocked, the power supply variable impedance circuit 6 provided in the region (2, 2) can be used. With this setting, the power supply impedance circuit 6 in which the power is supplied does not generate a desired power supply impedance, the power supply variable impedance circuit 6 in the region in which supplying power is blocked is used.

In the present third embodiment, since the power supply variable impedance circuit 6 is configured as a macro cell in the domain to switch between supplying power and blocking supply of power, a wiring can be connected with a short path based on wiring limitation and an operational frequency limitation of a low inductance between the power supply and the ground and the user logic circuit, which can achieve width power supply impedance setting.

Further, by providing the switching circuit to switch the control circuit to enable to control the power supply variable impedance circuit 6 provided in the domain in which the power supply is blocked, a resource of the power supply variable impedance circuit 6 can be efficiently utilized, and circuit size (the number) of the power supply variable impedance circuit 6 can become smaller.

(Fourth Embodiment)

Figure 12:
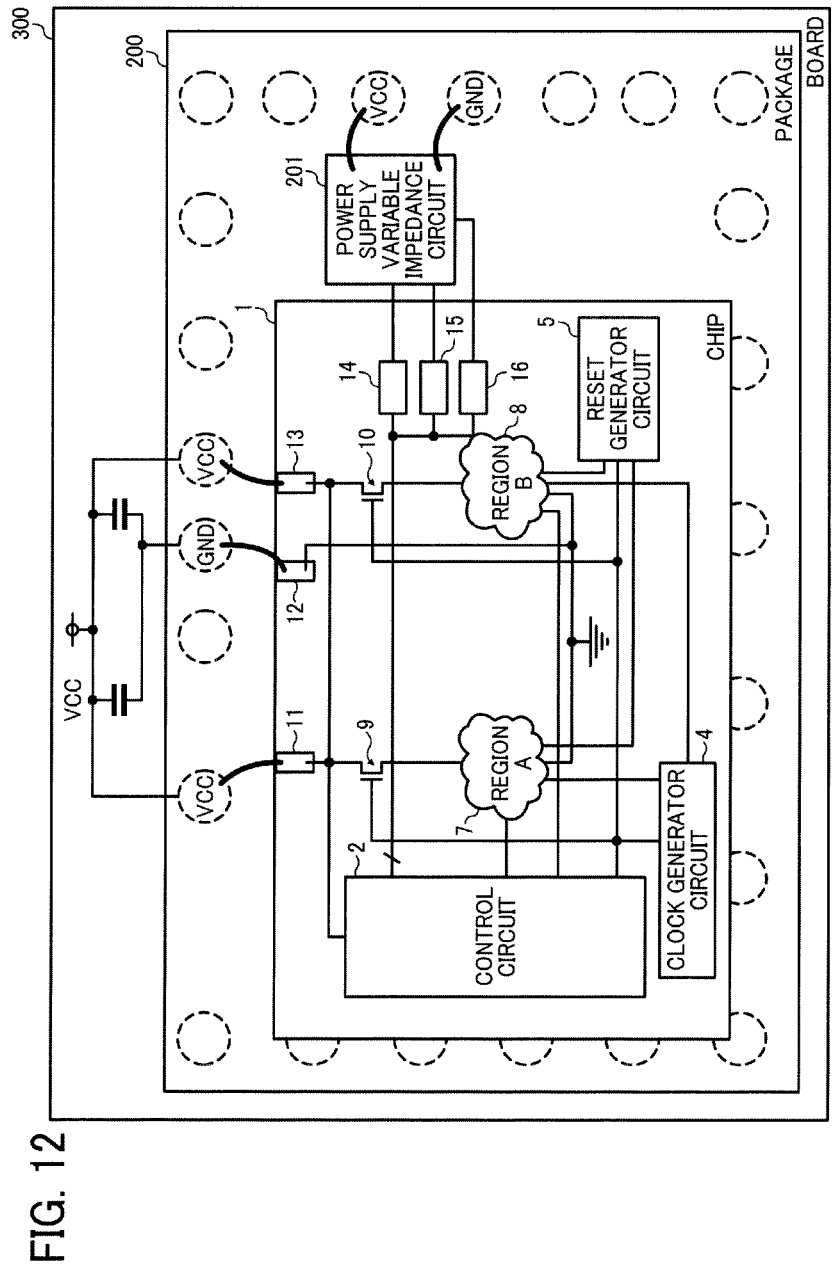
FIG 12 is a block diagram illustrating a configuration of a semiconductor integrated circuit according to a fourth embodiment.

Next, a package 200C, serving as an electronic circuit, according to a fourth embodiment is described below with reference to FIG 12. FIG 12 is a block diagram illustrating a configuration of a semiconductor integrated circuit according to a fourth embodiment. It is to be noted that, for ease of explanation and illustration, because other than the difference described above the fourth embodiment has a configuration similar to the configuration of the first, second, and third embodiments, other components of the fourth embodiment are represented by identical numerals and the description thereof is omitted below.

In the present embodiment, as illustrated in FIG 12, a power supply variable impedance circuit 201 is provided not in a chip 1C, but on the package 200C. Therefore, internal terminals 14, 15, and 16 to output a control signal to a power supply variable impedance circuit 201, output from the control circuit including a decode circuit 3 shown in FIG 1, for outputting outside of the chip 1C. That is, the semiconductor integrated circuit 1C includes a power supply impedance controller (decode circuit 3), and the power supply variable impedance circuit 201 is provided outside of the semiconductor integrated circuit 1C.

The power supply variable impedance circuit 201 is not limited to the circuit configuration of the first embodiment, alternatively, the circuit is configured by a switch circuit to enable to vary the capacitance value and the resistance value by connecting bi-pass capacitors in parallel, and switching them. The signals output from the internal terminals 14, 15, and 16 are the signal to directly switch the switch circuit. That is, the decode circuit 3 outputs a switching signal to directly switch the switch circuit.

In the present embodiment, the power supply variable impedance circuit 201 is provided on the package 200 outside of the chip 1C, which can change the power supply impedance using the bi-pass capacitors provided on the package 200. In a case in which the power supply variable impedance circuit 201 is changed to change variation width of the power supply impedance, only changing the package 200C is enough, and the design change of the chip 1C is not necessary.

In the fourth embodiment, the power supply variable impedance circuit 201 is provided on the package 200C, alternatively, the circuit 201 may be provided on the board 300.

In addition, in the above-described first to fourth embodiments, the power supply variable impedance circuit 6(201) may install a cooler such as a Peltier element. In this configuration, for example, heating the chip 1 by flowing en excess current to the power supply variable impedance circuit 6 can be prevented.

Numerous additional modifications and variations are possible in light of the above teachings. It is therefore to be understood that, within the scope of the appended claims, the disclosure of this patent specification may be practiced otherwise than as specifically described herein.

What is claimed is:

1. A semiconductor integrated circuit comprising:
multiple regions containing at least one switchable region to switch between supplying power and blocking power individually;
a power supply controller to control switching between supplying power and blocking supply of power in the switchable region that switches supplying power and blocking power individually;
a power supply variable impedance circuit to change a power supply impedance of the semiconductor integrated circuit;
a power supply impedance controller to obtain a power supplying state of the switchable region from the power supply controller, to cause the power supply variable impedance circuit to change the power supply impedance based on the power supplying state of the switchable region; and
a frequency detector to detect operation frequency in the corresponding switchable region,
wherein the power supply impedance controller causes the power supply variable impedance circuit to change the power supply impedance based on the power supplying state of the switchable region obtained by the power supply impedance controller and the operation frequency in the switchable region detected by the frequency detector.

2. A semiconductor integrated circuit comprising:
multiple regions containing at least one switchable region to switch between supplying power and blocking power individually;
a power supply controller to control switching between supplying power and blocking supply of power in the switchable region that switches supplying power and blocking power individually;
a power supply variable impedance circuit to change a power supply impedance of the semiconductor integrated circuit; and
a power supply impedance controller to obtain a power supplying state of the switchable region from the power supply controller, to cause the power supply variable impedance circuit to change the power supply impedance based on the power supplying state of the switchable region,
wherein the power supply controller comprises an impedance holder to maintain a power supply impedance setting value issuing an instruction to the power supply variable impedance circuit.

3. A semiconductor integrated circuit comprising:
multiple regions containing at least one switchable region to switch between supplying power and blocking power individually;
a power supply controller to control switching between supplying power and blocking supply of power in the switchable region that switches supplying power and blocking power individually;
a power supply variable impedance circuit to change a power supply impedance of the semiconductor integrated circuit; and
a power supply impedance controller to obtain a power supplying state of the switchable region from the power supply controller, to cause the power supply variable impedance circuit to change the power supply impedance based on the power supplying state of the switchable region,
wherein the power supply variable impedance circuit is configured to be a macro cell, and is provided inside the multiple regions.

4. The semiconductor integrated circuit according to claim 3, further comprising:
a switch circuit to make the power supply variable impedance circuit provided in a blocked region in which the power supply is blocked controllable by the power supply impedance controller.

5. The semiconductor integrated circuit according to claim 1, comprising multiple regions containing multiple switchable regions to switch between supplying power and blocking supply of power individually,
wherein the power supply controller arbitrarily sets the sequence of supplying power and blocking supply of power of the switchable regions respectively.

6. The semiconductor integrated circuit according to claim 5, wherein the power supply controller comprises a sequence holder to maintain the sequence of supplying power and blocking supply of power to the respective regions.

7. A semiconductor integrated circuit comprising:
multiple regions containing at least one switchable region to switch between supplying power and blocking power individually;
a power supply controller to control switching between supplying power and blocking supply of power in the switchable region that switches supplying power and blocking power individually;
a power supply variable impedance circuit to change a power supply impedance of the semiconductor integrated circuit; and
a power supply impedance controller to obtain a power supplying state of the switchable region from the power supply controller, to cause the power supply variable impedance circuit to change the power supply impedance based on the power supplying state of the switchable region,
wherein the power supply controller controls a clock signal and a reset signal before the power supply is blocked and after the power is supplied.

8. The semiconductor integrated circuit according to claim 7, further comprising:
a frequency detector to detect operation frequency in the corresponding switchable region,
wherein the power supply impedance controller causes the power supply variable impedance circuit to change the power supply impedance based on the power supplying state of the switchable region obtained by the power supply impedance controller and the operation frequency in the switchable region detected by the frequency detector.

9. The semiconductor integrated circuit according to claim 7, wherein the power supply controller comprises an impedance holder to maintain a power supply impedance setting value issuing an instruction to the power supply variable impedance circuit.

10. The semiconductor integrated circuit according to claim 7, wherein the power supply variable impedance circuit is configured to be a macro cell, and is provided inside the multiple regions.

11. The semiconductor integrated circuit according to claim 7, comprising multiple regions containing multiple switchable regions to switch between supplying power and blocking supply of power individually,
wherein the power supply controller arbitrarily sets the sequence of supplying power and blocking supply of power of the switchable regions respectively.

12. The semiconductor integrated circuit according to claim 1, wherein the power supply controller comprises an impedance holder to maintain a power supply impedance setting value issuing an instruction to the power supply variable impedance circuit.

13. The semiconductor integrated circuit according to claim 1, wherein the power supply variable impedance circuit is configured to be a macro cell, and is provided inside the multiple regions.

14. The semiconductor integrated circuit according to claim 13, further comprising:
a switch circuit to make the power supply variable impedance circuit provided in a blocked region in which the power supply is blocked controllable by the power supply impedance controller.

15. The semiconductor integrated circuit according to claim 2, wherein the power supply variable impedance circuit is configured to be a macro cell, and is provided inside the multiple regions.

16. The semiconductor integrated circuit according to claim 15, further comprising:
a switch circuit to make the power supply variable impedance circuit provided in a blocked region in which the power supply is blocked controllable by the power supply impedance controller.

17. The semiconductor integrated circuit according to claim 2, comprising multiple regions containing multiple switchable regions to switch between supplying power and blocking supply of power individually,
wherein the power supply controller arbitrarily sets the sequence of supplying power and blocking supply of power of the switchable regions respectively.

18. The semiconductor integrated circuit according to claim 17, wherein the power supply controller comprises a sequence holder to maintain the sequence of supplying power and blocking supply of power to the respective regions.

19. The semiconductor integrated circuit according to claim 3, comprising multiple regions containing multiple switchable regions to switch between supplying power and blocking supply of power individually,
wherein the power supply controller arbitrarily sets the sequence of supplying power and blocking supply of power of the switchable regions respectively.

20. The semiconductor integrated circuit according to claim 19, wherein the power supply controller comprises a sequence holder to maintain the sequence of supplying power and blocking supply of power to the respective regions.

* * * * *